United States Patent [19]

Robinson

[11] Patent Number: 4,900,692
[45] Date of Patent: Feb. 13, 1990

[54] METHOD OF FORMING AN OXIDE LINER AND ACTIVE AREA MASK FOR SELECTIVE EPITAXIAL GROWTH IN AN ISOLATION TRENCH

[75] Inventor: F. J. Robinson, Scottsdale, Ariz.

[73] Assignee: Motorola, Inc., Schaumburg, Ill.

[21] Appl. No.: 342,156

[22] Filed: Apr. 24, 1989

[51] Int. Cl.$^4$ .............................................. H01L 21/82
[52] U.S. Cl. ........................................ 437/67; 437/90
[58] Field of Search ................... 437/67, 238, 239, 90

[56] References Cited

U.S. PATENT DOCUMENTS 4,820,654  4/1989  Lee ........................................ 437/67

FOREIGN PATENT DOCUMENTS 60-20530  2/1985  Japan ..................................... 437/67
60-43843  3/1985  Japan ..................................... 437/67
61-174738 8/1986  Japan ..................................... 437/67

*Primary Examiner*—Olik Chaudhuri
*Attorney, Agent, or Firm*—Joe E. Barbee

[57] ABSTRACT

A new method is used to fabricate an isolation trench to prevent spurious epitaxial growth at the top edge of the trench opening and at pin holes in oxide over the active area. The method involves etching a deep trench into a semiconductor wafer that is patterned with a mask oxide layer, and then depositing a low temperature oxide, followed by growing a thermal oxide layer under the mask oxide and in the trench. When the oxide at the bottom of the trench is removed to provide a seed for the growth of selective epitaxial silicon, an oxide layer thick enough to leave a protective coating over the active area and at the trench opening is provided which prevents spruious epitaxial silicon growth.

4 Claims, 1 Drawing Sheet

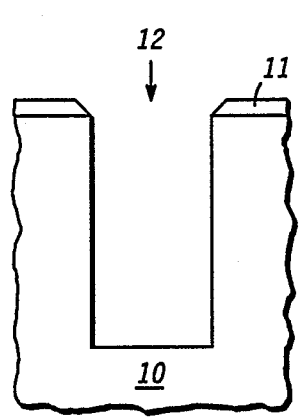
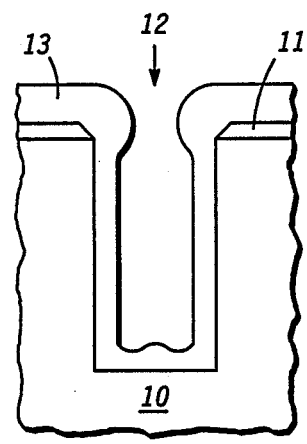
FIG. 1          FIG. 2
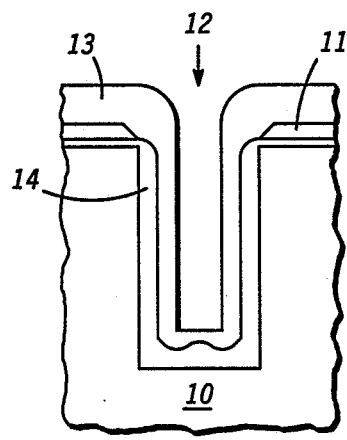
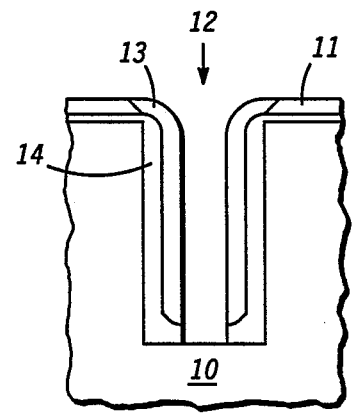
FIG. 3          FIG. 4

METHOD OF FORMING AN OXIDE LINER AND ACTIVE AREA MASK FOR SELECTIVE EPITAXIAL GROWTH IN AN ISOLATION TRENCH

BACKGROUND OF THE INVENTION

This invention relates, in general, to semiconductor devices and, more particularly, to a method of forming trench isolation regions in a semiconductor device.

Trenches are used to isolate semiconductor device regions on a single semiconductor epitaxial layer. In certain applications, it is desirable to refill the trench with selective epitaxial silicon growth to make contact to the semiconductor substrate. Isolated regions are formed in the epitaxial layer by providing an oxide layer lining the trench sidewalls.

Several problems can arise while forming these types of trenches. The process of fabricating a trench begins with forming a mask oxide layer on a surface of a semiconductor wafer, and providing an opening in the mask silicon dioxide (oxide). Because a silicon etch also etches oxide, a thick mask oxide is needed in order to have sufficient mask oxide left when a trench greater than approximately 10 microns is etched. Due to the silicon-silicon dioxide selectivities of 10:1 to 20:1, the mask oxide must be greater than or equal to 20,000 angstroms for any of it to remain after the trench is etched. This thick oxide requires thick photoresist to define the pattern into the oxide layer. The thicker resist combined with projection exposure results in a very low contrast image. The soft edge angle of the resist replicates into the mask oxide resulting in edge profiles with angles between 40° and 50° from horizontal. Trenches less than approximately 10 microns in depth do not exhibit this problem because a thick mask oxide is not needed.

After the trench is etched, the trench and the mask oxide is lined with a thermal oxide. The liner oxide must then be removed from the bottom of the trench only to expose the semiconductor surface to selectively grow epitaxial silicon using the semiconductor as a seed. When the liner oxide is reactive ion etched from the bottom of the trench to provide the seed for the selective epitaxial growth, a similar amount is etched from the top of the wafer. If the mask oxide remaining is not significantly greater than the liner oxide thickness, there will be insufficient oxide masking the active areas during selective epitaxial growth. Even if there is enough oxide, the very soft slope results in a region of thinner oxide at the top corner of the trench opening. Spurious epitaxial silicon growth can occur during the selective epitaxial growth in the active area through pin holes in the oxide layer or at particles on the semiconductor surface. More seriously, spurious epitaxial silicon growth can occur at the top corner of the trench where the thermal oxide is the thinnest due to the etching during the removal of the liner oxide layer from the bottom of the trench. This spurious epitaxial growth at the trench opening can close the top of the trench before it is filled with selective epitaxial silicon.

One solution to prevent spurious epitaxial growth at the corner of the trench opening is to use a high contrast, vertical edge profile mask. In this way, the mask oxide will have a more vertical slope and thus cover the corner of the trench sufficiently. The only consistent methods to accomplish this are to use a new high contrast resist and process or a tri-level or bi-level mask process. Both of these methods are undesirable because a new resist may not be compatible with existing processes and the added complexity of multi-level masking is quite expensive.

Another possible solution is to do a controlled undercut etch of the mask oxide prior to the silicon trench etch. The undercut moves the top corner of the trench back from the thin oxide region. This process is undesirable because it requires extra processing and the trench width is increased. In addition, the solutions discussed above address only the problem of spurious epitaxial growth at the top corner of the trench. Pin holes forming in the thin oxide over the active area is still a problem. Thus, there is a need to provide a means of preventing spurious epitaxial silicon growth during the selective epitaxial growth in a deep isolation trench. This method must be compatible with existing processes, and must not increase the width of the trench.

By now, it should be appreciated that it would be advantageous to provide a method of preventing spurious epitaxial silicon growth when forming an isolation trench.

Accordingly, it is an object of the present invention to provide a method of increasing the thickness of the oxide at the top corner of the trench opening to prevent spurious epitaxial silicon growth.

Another object of the present invention is to provide a method of increasing the thickness of oxide over the semiconductor wafer surface to prevent spurious epitaxial silicon growth.

A further object of the present invention is to provide an improved method of depositing thicker oxide on the semiconductor surface than in the trench.

SUMMARY OF THE INVENTION

In accordance with the present invention, the above and other objects and advantages are achieved by depositing an oxide layer and then growing a thermal oxide layer on a semiconductor substrate having a trench formed therein. The deposited oxide forms a cusping at the top of the trench, thus reducing the deposition of oxide in the trench, and thereby forming a thicker oxide layer on the surface. The subsequent thermal oxidation completes the liner oxide, and densifies the deposited oxide at the same time. The thermal oxidation also levels the surface of the deposited oxide by growing faster where the deposited oxide is thinner and slower where it is thicker, to provide for a liner oxide having uniform thickness. This results in a thick oxide being left over the active area and at the top corners of the trench after the liner oxide is etched from the bottom of the trench. Thus, enough oxide is left to prevent spurious epitaxial growth on the active areas and at the top corner of the trench.

BRIEF DESCRIPTION OF THE DRAWINGS

FIGS. 1–4 illustrate enlarged cross-sectional views of a trench isolation structure during various stages of fabrication using an embodiment of the present invention.

The preferred embodiments of the invention are illustrated in the accompanying drawings for purposes of exemplification, and are not to be construed as limiting in any manner.

DETAILED DESCRIPTION OF THE DRAWINGS

FIG. 1 illustrates a structure at a beginning stage of a fabrication process embodying the present invention. First, a semiconductor wafer 10 is provided. A process using a silicon wafer 10 is described for purposes of illustration Subsequently, a masking layer 11 is deposited on the surface of semiconductor wafer 10. Masking layer 11 is then patterned using standard photolithography and etch techniques well known in the art.

Masking layer 11 is preferably formed from a low temperature oxidation layer having a thickness of approximately 20,000 angstroms. Next a silicon etch is performed to form a trench 12 in semiconductor wafer 10. Trench 12 is etched to a depth of approximately 10 to 25 microns using any suitable silicon etch. After the silicon etch, approximately 4000 to 7000 angstroms of mask oxide 11 is left.

FIG. 2 illustrates the structure of FIG. 1 with an oxide 13 deposited in trench 12 and over mask oxide 11 using standard processes well known in the art. The deposition of oxide 13 is typically done at low temperatures, thus oxide 13 is called a low temperature oxide (LTO or LTOX). The thickness of oxide layer 13 is preferably approximately 5,000 to 10,000 angstroms. Note that the cusping of oxide layer 13 at the opening of trench 12 reduces the deposition of oxide 13 on the sidewalls of trench 12, thus giving a thicker oxide 13 at the surface of mask oxide 11.

FIG. 3 illustrates the structure of FIG. 2 having a thermal oxide layer 14 grown under deposited oxide layer 13. The amount of thermal oxide 14 is preferably equivalent to approximately 1000 to 3000 angstroms of equivalent oxide that would be grown on bare silicon. Thermal oxide layer 14 will tend to level the surface of deposited oxide 13 as it grows, because more oxygen can diffuse to semiconductor wafer 10 through thin oxide layers. Thus, only a small amount of oxide 14 will grow under oxide 13 and oxide 11 on the surface of wafer 10. A uniform thickness of oxide 13 and 14 is desirable to improve the uniformity of the etch process (shown in FIG. In addition, the growth of thermal oxide layer 14 also densifies the deposited oxide 13 at the same time.

FIG. 4 illustrates the structure of FIG. 3 after an oxide etch has been performed to remove oxide layers 13 and 14 from the bottom of trench 12. A directional etch such as a reactive ion etch (RIE) is preferably used. During this oxide etch, oxide layers 13 and 14 are also etched at the surface of semiconductor wafer 10 but not totally removed. In the present invention, sufficient deposited oxide 13 is left at the top corners of trench 12. Thus, enough of oxide layer 13 is left at the top corner of trench 12 which prevents spurious epitaxial silicon growth during the selective epitaxial growth in the deep trench (not shown). A thick enough layer of oxide 11 is also provided at the surface of wafer 10 to prevent pin holes from forming in oxide 11 over the active area.

By now it should be appreciated that there has been provided a new and improved method of fabricating a trench filled with selective epitaxial silicon and isolated by an oxide liner.

I claim:

1. A method of fabricating a trench isolation structure, comprising the steps of:
    providing a semiconductor substrate having a surface;
    providing a mask made of an oxide layer disposed on the semiconductor substrate;
    removing portions of the mask to provide at least one opening to the semiconductor substrate;
    removing portions of the substrate through the mask opening to form a trench in the substrate, wherein the trench is at least approximately 10 microns in depth from the surface of the substrate;
    depositing a first oxide layer such that the first oxide layer is thicker on the mask than in the trench;
    growing a second oxide layer to densify and level out the first oxide layer; and
    removing the first and second oxide layers at the bottom of the trench and removing a portion of the first oxide layer at the surface of the substrate.

2. The method of claim 1 wherein the first oxide layer is a low temperature oxide, and the second oxide layer is a thermal oxide layer.

3. A method of fabricating a trench isolation structure, comprising the steps of:
    providing a semiconductor substrate having a surface;
    providing an oxide mask on the surface of the substrate, wherein the mask has at least one opening therein;
    etching the substrate through the mask opening to form a trench having a depth of at least approximately 10 microns from the surface of the substrate;
    depositing a low temperature oxide such that cusping at the top of the trench reduces the deposition of the low temperature oxide in the trench thereby depositing a thicker amount on the surface of the oxide mask than on the trench sidewalls;
    growing a thermal oxide layer under the low temperature oxide layer to densify and to level out the low temperature oxide; and
    etching the low temperature oxide and the thermal oxide located at the bottom of the trench and etching a portion of the low temperature oxide from the substrate surface, wherein sufficient oxide is left at the trench opening and over the substrate to prevent spurious epitaxial growth.

4. A method of fabricating a trench isolation structure, comprising the steps of:
    providing a trench of at least 10 microns in depth in a semiconductor substrate, formed by etching the substrate through an oxide mask opening;
    depositing a first oxide layer so that the first oxide layer is thicker on the mask oxide than on the trench sidewalls;
    growing a second oxide layer to densify and to level out the first oxide layer; and
    removing a portion of the first oxide layer from the substrate surface and removing the first and second oxide layers at the bottom of the trench to provide for a seed for growing a selective semiconductor layer in the trench.

* * * * *